United States Patent [19]

Cohen et al.

[11] 4,356,251

[45] * Oct. 26, 1982

[54] MULTILAYER PHOTOSENSITIVE ELEMENT WITH SOLVENT-SOLUBLE LAYER

[75] Inventors: Abraham B. Cohen, Springfield; Roxy Fan, East Brunswick, both of N.J.

[73] Assignee: E. I. Du Pont de Nemours and Company, Wilmington, Del.

[*] Notice: The portion of the term of this patent subsequent to Jul. 25, 1997, has been disclaimed.

[21] Appl. No.: 174,919

[22] Filed: Aug. 4, 1980

Related U.S. Application Data

[63] Continuation of Ser. No. 747,024, Dec. 2, 1976, abandoned, which is a continuation-in-part of Ser. No. 583,455, Jun. 3, 1975, abandoned.

[51] Int. Cl.$^3$ .............................................. G03C 1/78
[52] U.S. Cl. .................................. 430/253; 430/271; 430/281
[58] Field of Search ................ 430/271, 281, 253, 260

[56] References Cited

U.S. PATENT DOCUMENTS

| | | | |
|---|---|---|---|
| 3,241,973 | 3/1966 | Thommes | 430/281 |
| 3,359,107 | 12/1967 | Goffe et al. | 430/531 |
| 3,375,112 | 3/1968 | Theodorou | 430/271 |
| 3,615,435 | 10/1971 | Chu et al. | 430/271 |
| 3,754,920 | 8/1973 | Kuchta | 430/271 |
| 3,770,438 | 11/1973 | Celeste | 430/271 |
| 3,891,441 | 6/1975 | Tsuji et al. | 430/271 |

FOREIGN PATENT DOCUMENTS 7413916 10/1974 Netherlands .

*Primary Examiner*—Jack P. Brammer

[57] ABSTRACT

An improved photosensitive element for producing reverse solvent developed images comprising a cover sheet, a photoadherent layer, and a solvent-soluble, non-tonable contiguous layer for photomechanical applications.

18 Claims, 1 Drawing Figure

MULTILAYER PHOTOSENSITIVE ELEMENT WITH SOLVENT-SOLUBLE LAYER

CROSS REFERENCE TO PRIOR APPLICATION

This is a continuation of application Ser. No. 747,024, filed Dec. 2, 1976, now abandoned, which is a continuation-in-part of application Ser. No. 583,455, filed June 3, 1975, now abandoned.

BACKGROUND OF THE INVENTION

1. Field of the Invention

The invention relates to the field of image reproduction with photosensitive elements, particularly those comprising polymeric layers, which are peeled apart in the process of forming reverse solvent developed images. Such elements are particularly useful for image reproduction and for color proofing and related photomechanical uses, e.g., as lithographic transparencies, photomasks, photoresists, etc.

2. Description of the Prior Art

The prior art describes a variety of photopolymer elements and processes of use, which include producing an image by toning unexposed areas of a photopolymer layer, by image transfer, and producing an image by peeling a photosensitive element apart. In addition, such prior art as U.S. Pat. Nos. 3,469,982 and 3,526,504 describe producing a resist image from an imagewise exposed photopolymerizable or photocrosslinkable layer by washing out the unexposed areas of the layer. The elements of the prior art each have a specific utility and likewise have limitations which limit their usefulness in other applications. For example, in the development of photoresists, the incomplete washing out of the unexposed areas of the photoresist layer may result in defective printed circuits due to incomplete plating or etching. An element is needed for photoresists, graphic arts and other applications which can produce a polymeric image in the exposed areas by complete solvent development and which can produce images of colored polymeric material having a high optical density without interfering with the characteristics of the photosensitive element.

SUMMARY OF THE INVENTION

In accordance with this invention improved peel apart photosensitive elements are provided which comprise, in order, from top to bottom, (1) a strippable cover sheet, (2) a photoadherent layer comprising a material with ethylenically unsaturated or benzophenone type groups, (3) a solvent-soluble, non-tonable contiguous layer, and optionally (4) a sheet support, after imagewise exposure of said element to actinic radiation, the exposed areas of said photoadherent layer having greater adhesion to said contiguous layer than to said cover sheet and are not removable with said cover sheet and the unexposed areas of said photoadherent layer having greater adhesion to said cover sheet than to said contiguous layer and are removable with said cover sheet, said exposed areas of the photoadherent layer being insoluble under a condition under which said contiguous layer is solvent-solbule.

BRIEF DESCRIPTION OF THE DRAWINGS

The FIGURE of the drawing shows a preferred embodiment comprising a strippable cover sheet 1, a photoadherent layer 2, a contiguous solvent-soluble, non-tonable layer 3 and a support 4. The areas 5 of the photoadherent layer adhere to and are removed with the cover sheet after imagewise exposure of the element to actinic radiation leaving insoluble areas 6 of the photoadherent layer remaining on the contiguous layer. Areas 5 are the unexposed areas of the photoadherent layer and areas 6 are the exposed areas. The areas 7 of the contiguous layer which are between the insoluble remaining areas of the photoadherent layer are then washed out with a solvent in which the areas 7 are soluble and in which areas 6 are insoluble. Preferably a reverse polymeric image is produced.

DESCRIPTION OF THE PREFERRED EMBODIMENT

Figure 1:
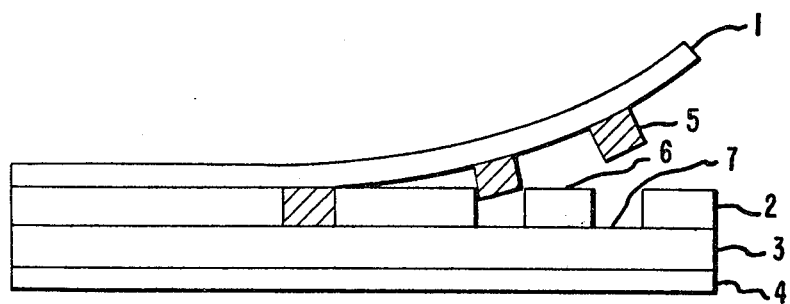

The invention is a versatile photosensitive element capable of producing a variety of images, most preferably, reverse polymeric images for use as photoresists and, where the image is colored, as photomasks, transparencies, and the like. The photoadherent layer, which is preferably the sole photosensitive layer of the element, is one whose adhesive relationship between the cover sheet and the contiguous layer is altered by exposure to actinic radiation so that after exposure the unexposed areas of the photoadherent layer adhere more strongly to the cover sheet than to the contiguous layer and are removed with the cover sheet leaving the exposed areas photoadhered to the contiguous layer. The exposed areas of the photoadherent layer remaining on the contiguous layer after stripping off the cover sheet must be insoluble under a condition under which the contiguous layer is soluble so that the areas of the contiguous layer may be washed out imagewise while the remaining exposed areas of the photoadherent layer which are insoluble in the solvent prevent the areas of the contiguous layer underneath them from being washed out. The difference in the solubility of the photoadherent layer and the contiguous layer may exist in the element in its original unexposed condition or may be induced by the imagewise exposure to actinic radiation, or other intermediate treatment such as uniform post exposure to actinic radiation, treatment with a reagent, heating, etc., depending on the particular materials of the element. For example, after imagewise exposure and stripping off of the cover sheet, an element containing a photosoluble contiguous layer may be given overall exposure to actinic radiation thereby further hardening and rendering the remaining areas of the photoadherent layer more insoluble while solubilizing the bared or uncovered image areas of the contiguous layer. It is only required that under some condition the exposed areas of the photoadherent layer remaining on the contiguous layer be insoluble in a solvent in which the contiguous layer is soluble.

By "washing out" is meant the removal of material by using a solvent, which may include agitation in a bath of solvent, with the aid of mechanical action such as brushing or spraying. The insoluble property of the remaining exposed areas of the photoadherent layer and the soluble property of the contiguous layer may be due to their respective degrees of photohardening or degree of polymerization or to their respective degrees of absorptivity, hydrophilicity or reactivity with respect to the solvent.

Various solvents suitable for use are disclosed in the prior art. The particular solvent to be used will depend on the materials of which the photoadherent layer and the contiguous layer are composed and the method of use of the element (e.g., whether it is given an overall additional exposure to actinic radiation after stripping the cover sheet). Such hydrocarbon solvents as 1,1,1-trichloroethane, benzene, toluene, and hexane, for example, are known in the art for washing out areas of polymeric layers for image development. In the case of certain polymers, water and dilute aqueous alkali or acid solutions may be used, depending on the particular materials of the element.

The strippable cover sheet of the element of the invention must be strippable (i.e., removable by peeling it apart) from the rest of the element, carrying with it only unexposed areas of the photoadherent layer. The cover sheet is preferably oxygen impermeable and transparent to actinic radiation so that the element may be exposed through the cover sheet. Preferred materials for the cover sheet are polymeric films, particularly polyester films such as polyethylene terephthalate. Polyamide, polimide, polystyrene, or polyolefin, e.g., polyethylene or polypropylene films may also be employed. In order to make the unexposed areas of the photoadherent layer adhere better to the cover sheet, the cover sheet's surface may be modified; for example, the topography may be altered and the polarity increased by a surface treatment such as electrostatic discharge or flame treatment. The cover sheet may additionally undergo auxiliary treatment or bear layers to improve adhesion, strength, and other properties.

While the thickness of the cover sheet may be varied over a wide range, films having a thickness of 0.001 inch or less are particularly preferred. Thin cover sheets produce halftone dots of good roundness with sharp edges. In addition a tonal range of 2%-98% dot resolution (using a halftone screen with 150 lines/inch) is obtainable with thin cover films. By "tonal range" is meant the range of sizes of resolvable halftone dots as a percentage of a maximum dot size. The cover sheet should be thick enough so that electrostatic discharge or flame treatment if used will not injure it and so that it may be stripped without tearing.

The exposed areas of the photoadherent layer adhere more strongly to the contiguous layer than to the cover sheet layer after imagewise exposure to actinic light. Preferably, the photoadherent layer is comprised of a material such as that disclosed in U.S. Pat. No. 3,770,438, or other composition that adheres more strongly to the cover sheet than to the contiguous layer in the unexposed areas and more strongly to the contiguous layer than to the cover sheet in the exposed areas.

As stated above, the unexposed areas of the photoadherent layer adhere more strongly to the cover sheet than to the contiguous layer in the unexposed areas and more strongly to the contiguous layer than to the cover sheet in the exposed areas. Photohardenable materials are preferred for the photoadherent layer. Such materials are usually comprised of a material with ethylenically unsaturated or benzophenone-type groups in which an increase in molecular weight and, consequently, an increase in adherence to the contiguous layer are caused by exposure to actinic radiation. The well-known photohardenable materials which are comprised of ethylenically unsaturated material which is photopolymerizable, photocrosslinkable, photodimerizable or combinations thereof are preferred. Particularly preferred are photopolymerizable compositions comprised of a macromolecular organic polymer binder and an addition polymerizable ethylenically unsaturated monomer which is present in a quantity in excess of the absorptive capacity of the binder for the monomer so that a thin layer of substantially free monomer is present on the surface layer 30 of the composition. The monomer has at least one and preferably two or more terminal ethylenically unsaturated groups capable of free radical initiated, chain propagated addition polymerization. In a preferred embodiment, the contact angle of the monomer on the cover sheet should be at least 2° greater than that of the monomer on the contiguous layer, but the monomer should be substantially nondiffusible in the contiguous layer. The photopolymerizable composition will also contain a free radical generation addition polymerization photoinitiating system (i.e., at least one organic photoinitiator compound) activatable by actinic radiation, e.g., ultraviolet and visible radiation. Among binders which have been found useful, are those disclosed in Celeste U.S. Pat. No. 3,770,438 and Collier, et al., U.S. Pat. No. 3,984,244. Among the ethylenically unsaturated monomers which have been found useful are those disclosed in Plambeck, U.S. Pat. No. 2,760,863; Cohen and Schoenthaler, U.S. Pat. No. 3,380,831 and Chambers and Woodward, U.S. Pat. No. 3,573,918. Also useful are epoxy monomers containing ethylenic unsaturation of the type disclosed in U.S. Pat. No. 3,661,576 and British Pat. No. 1,006,587. There may be mentioned as examples dipentaerythritol acrylate (50% tetra and 50% penta), pentaerythritol triacrylate and tetraacrylate, polypropylene glycol (50) ether of pentaerythritol tetraacrylate, polyethylene glycol (200) dimethacrylate, dipentaerythritol monohydroxy pentaacrylate, pentaerythritol triacrylate $\beta$-hydroxyethyl ether, polypropylene glycol (550) ether of pentaerythritol tetramethacrylate, pentaerythritol tetramethacrylate, polypropylene glycol (425) dimethacrylate, trimethylolpropane trimethacrylate, and polypropylene glycol (340) ether of trimethylol propane triacrylate. The binder may be varied widely in its ratio with the monomer, but the monomer should be compatible with, and may be a solvent for, and/or have a plasticizing action on the binder. The choice and proportions of monomer and binder are made in accordance with the requirements of selective photoadherence to the contiguous and the resulting insolubility in a solvent for the contiguous layer. Usually the photoadherent layer will be clear, but for some applications a colored layer may be desired.

The free radical generating addition polymerization initiating systems activatable by actinic radiation may be, for example, any of those disclosed in Notley, U.S. Pat. No. 2,951,752; Chang and Fan, U.S. Pat. No. 3,549,367; Fan, U.S. Pat. No. 3,558,322; and Chang, U.S. Pat. No. 3,926,643. Other particularly useful initiating systems are disclosed in Cescon et al., U.S. Pat. No. 3,615,454; Grub, U.S. Pat. No. 3,647,467; Baum et al., U.S. Pat. No. 3,652,275; Chang, U.S. Pat. No. 3,661,558; and Strilko, U.S. Pat. No. 3,697,280. The photopolymerizable layer may also contain other ingredients including plasticizers, antihalation agents and optical brightening agents. By the incorporation of optical brightening agents in the photoadherent layer, the image record is produced free from distortion due to halation effects and free from discoloration due to element components. Suitable optical brighteners can be found in Keller, U.S. Pat. No. 2,784,183 and Gurney, U.S. Pat. No. 3,644,394. Specific compounds which are particularly useful in the photopolymerizable layers of this invention are 2-(stilbyl-4")-(naphtho-1',2':4,5)-1,2,3-triazol-2"-sulfonic acid phenyl ester hereinafter designated as Brightenor I and 7-(4′-chloro-6′-diethylamino-1′,3′,5′-triazine-4′-yl) amino-3-phenyl-coumarin hereinafter designed as Brightener II. These compounds are useful in preparing sharp, bright, multicolor images with clean white backgrounds on toning with colorants as shown in U.S. Pat. No. 3,854,950.

While the coating weight of the photoadherent composition may be varied, it has been found that a preferred range from 20-100 mg/dm$^2$ (providing a dry layer thickness of about 0.00006-0.00033 inch) will give good image quality and tonal range.

The contiguous layer may be chosen from a great number of materials that will be soluble at least after imagewise exposure of the element to radiation that is actinic to the photoadherent layer. Preferably, the contiguous layer will be a nonphotosensitive nontacky polymeric material which is soluble in conventional solvents. However, it may be photosensitive, e.g., a photo-soluble material such as disclosed in U.S. Pat. No. 3,837,860, which is soluble only after exposure to actinic radiation. Polymers soluble in aqueous solutions may be used for the contiguous layer where it is desired to use an aqueous solvent for wash out. For an element with good aging stability, suitable materials for the contiguous layer should restrain monomer diffusion from the photoadherent layer into the contiguous layer. Such materials may be selected from resins, polymers in which monomer of the photoadherent layer is substantially nondiffusible, nonadhesive compositions, etc. Among preferred materials for contiguous layers that can be washed out according to the invention, are polymeric materials soluble in aqueous solutions, such as polyvinyl alcohol, polyvinyl pyrrolidone, polyvinyl pyrrolidone/vinyl acetate, sodium carboxymethyl cellulose, hydroxy propyl cellulose, polyethylene oxide and acid or anhydride containing binders such as copolymers of maleic anhydride with styrene, vinyl methyl ether, methyl methacrylate, methacrylic acid, or acrylic acid, etc. Also useful are polymeric materials soluble in hydrocarbon or halogenated hydrocarbon solvents which have a softening temperature above room temperature such as binders disclosed in U.S. Pat. No. 3,469,982 and U.S. Pat. No. 3,984,244. The contiguous layer may be comprised of the polymer or resin alone or it may contain other additives to improve or modify its properties such as plasticizers, pigments, colorants, fillers, brighteners, etc., provided such additives do not render the contiguous layer tacky. With these materials, a stable adhesion balance between the photoadherent layer, the contiguous layer and a support for the contiguous layer may be achieved for preferred elements useful in making color proofs by the overlay method.

Any suitable solvent may be used to coat the contiguous layer as long as it does not cause migration of components of the layer into the photoadherent layer when the two layers are coated simultaneously. The coating weight of the contiguous layer may be varied over a wide range, but generally a coating weight of about 40 mg/dm$^2$ (generally providing a dry thickness of about 0.00015 inch) will be satisfactory. The contiguous layer may also be coated as a dispersion, e.g., an aqueous dispersion with satisfactory results. In a preferred embodiment, which is illustrated in the drawings, the element has a support (4) for the contiguous layer (3). The support (4) may be any suitable film which has the necessary characteristics for the proper adhesion to layer (3) dependent upon how the element is to be used, i.e., for color proofing, e.g., overlay color proofing or for making photomasks, litho negatives, etc., for photomechanical processes. For color proofing by the overlay method, for example, photographic grade polyethylene terephthalate films which may or may not contain an anchoring layer such as those disclosed in Alles, U.S. Pat. No. 2,779,684 may be used. Similarly, films which have a releasable coating, e.g., a silicone coating, may also be used. A thermoplastic layer may also be used which allows support (4) to be easily stripped from layer (3) yet holds layers (3) and (4) together when heat laminated or delaminated.

In the case where a thermoplastic layer is used, the stripping operation leaves the thermoplastic layer attached to the contiguous layer (3). A release film that does not require any special treatment is obviously the most convenient.

The manufacture of the above-described elements may be accomplished in several different ways. For example, the photoadherent layer (2) may be coated on the cover sheet (1) and then after drying, contiguous layer (3) is coated from a solvent solution and then after drying, a support (4) may be laminated to the surface of layer (3). The solvent for the contiguous layer (3) should not have any solubilizing or deleterious effect on photoadherent layer (2). Another method is to coat the photoadherent layer (2) onto the cover sheet (1) and coat layer (3) onto a support (4) and then after drying the coated layers, laminating the surfaces of layers (2) and (3) under pressure at room temperature or elevated temperature. Layers (2) and (3) may also be coated simultaneously in order on support (1) and then a support (4) may be laminated to the outer surface of layer (3). All of these methods are known to those skilled in the art of coating multilayer films.

The element of the invention is capable of producing negative or reverse images (i.e., complementary images). Accordingly, with an element of the invention, a polymeric image may be produced by exposing the element, stripping the cover sheet, and washing out with a solvent. The soluble contiguous layer provides a layer in which a high density of colorant may be incorporated if desired without interfering with the photosensitivity or operability of the element and whose composition may be selected to provide good adhesion where the contiguous layer is to be laminated to a separate surface. Alternatively, the photoadherent layer can contain a colorant, thus producing a duplicate image on the stripped cover sheet and a reverse image on the contiguous layer.

In using the novel film elements of this invention, the film elements are exposed to image-bearing transparencies, e.g., conventional halftone color separation positives, by means of actinic radiation to which the photoadherent layer is most sensitive, e.g., a carbon arc which is rich in ultraviolet radiation. Other radiation sources which may be used include mercury vapor or pulsed xenon lamps and lasers. The exposed elements are then delaminated generally at room temperature by stripping with a continuous motion the cover sheet (1) from the element at an angle of generally at least 135° leaving an unhardened positive image on the cover sheet and an image of uncovered contiguous layer on the element. The exposed and insoluble negative image areas of photoadherent layer (2) remain photoadhered to the contiguous layer (3). The bared areas of the contiguous layer are than washed out with a solvent to give a negative image.

EXAMPLES OF THE INVENTION

The following examples illustrate the invention.

EXAMPLE 1

A printed circuit is made on a copper-clad epoxy board in the following manner:

I. Photoadherent Layers: Photopolymerizable Coating Composition

For the photoadherent layer a coating solution of a photopolymerizable composition is prepared by mixing together the following ingredients:

Chlorinated rubber (Parlon ® S-5 by Hercules Powder Company) (67% chlorinated—20% solution in toluene at 25° C. has a viscosity of 4–7 centipoise): 22.0 g
Pentaerythritol triacrylate: 15.0 g
2-Tertiary butyl anthraquinone: 2.0 g
2,2'-Methylene-bis-(4-ethyl-6-t-butylphenol): 2.0 g
Methyl chloroform: 444.0 g The solution is coated on polyethylene terephthalate film having a thickness of 0.001 inch to give a dry coating weight of about 42 mg/dm$^2$.

II. Contiguous Layer

A coating composition is prepared by mixing together the following ingredients:

Poly (methylmethacrylate/methacrylic acid) (98.5/1.5): 37.6 g
Poly methylmethacrylate (intrinsic viscosity 1.2): 12.5 g
Pentaerythritol triacrylate 38.1 g
Triethyleneglycol diacetate: 5.4 g
Tert-butyl anthraquinone: 5.4 g
2,2'-Methylene-bis-(4-ethyl-6-t-butylphenol): 0.7 g
Victoria Pure Blue B.O.(C.I. 42595): 0.3 g
Lacer Wax (pentaerythritol ester of fatty acids derived from grape seed oil): 6.0 g
Methylene chloride: 530.0 g The resulting solution is coated on a sample of polyethylene terephthalate film having a releasable layer of polydimethyl/siloxane coated thereon to give a coating weight of 230 mg/dm$^2$. The coating does not retain toner.

III. Operations for Constructing a Printed Circuit

The contiguous layer surface of element II is laminated to 110° C. and a pressure of about 40 pounds per square inch at 2 ft./minute to the surface of a copper clad epoxy board which is conventionally used in the preparation of printed circuits. The copper surface has been degreased and cleaned as is known in the art. The film with the releasable layer is stripped from the contiguous layer which is then laminated in surface to surface contact with the coated layer of element (I) at 104° C. with a pressure of 40 lbs. per square inch at 6 ft./minute.

The resulting element is exposed as in Example 2 through a negative transparency of the desired printed circuit through the clear film cover sheet contiguous with the photopolymerizable layer. The clear film cover sheet is then stripped off at a moderate rate with a continuous motion. The unexposed areas adhere to the cover sheet leaving an exposed image of the circuit pattern photoadhered to the blue contiguous layer. A light blue duplicate image is developed on the board by wiping with a cotton pad soaked with methyl chloroform which removes the uncovered areas of the contiguous layer.

The circuit board is then immersed in a conventional ferric chloride etching solution to remove the unwanted copper layer. The remaining photopolymer layer and underlying contiguous layer is then removed by methylene Chloride to give a good quality printed circuit.

This process is useful in arranging the exposure of a transparency in such a manner that the desired conductive pattern may be formed by plating, chemical milling or other methods of modification as taught by Celeste, U.S. Pat. No. 3,469,982.

For example, the etchable metal surface may be magnesium, zinc, copper, alloys of such metals, aluminum, anodized and dyed anodized aluminum, steel alloys, beryllium-copper alloys, etc.

EXAMPLE 2

An element wherein the solvent soluble contiguous layer contains a colorant is made as follows:

I. Photoadherent Layer: Photopolymerizable Coating Composition

A coating solution prepared as in part (I) of Example 1 is coated on polyethylene terephthalate film having a thickness of 0.001 inch to give a dry coating weight of about 52 mg/dm$^2$.

II. Contiguous Layer: Colored Solvent Soluble Layer

A coating composition is prepared by mixing together the following ingredients:

1:1 copolymer of methyl vinyl ether and maleic anhydride, partially esterified with ethanol, acid No ca.285: 20.0 g
Brilliant Green Crystal (CI42040) (1% Methylene Chloride Solar): 1.0 ml
Methylene Chloride: 80.0 g
Methanol: 5.0 g
Ethanol: 20.0 g The resulting solution is coated on polyethylene terephthalate film having a thickness of 0.001 inch to give a dry coating weight of about 113 mg/dm$^2$.

III. Lamination Procedure

The photoadherent layer (I) and the contiguous layer (II) are laminated together in surface to surface relationship under pressure at 40 pounds per square inch at room temperature.

IV. Exposure, Imaging Procedure

The laminated element resulting from Step III is exposed through halftone color separation transparency (next to the cover sheet) by means of a pulsed Xenon lamp (nuArc Flip-Top Model 17 ampere) for 4 minutes. The polyethylene terephthalate cover sheet is stripped from the imaged photoadherent layer. The unexposed areas of the clear photoadherent layer adhere to the cover sheet and are removed therewith. The complementary exposed image areas photoadhere to the green contiguous layer. The bared areas of the contiguous layer are removed by wiping with a cotton pad soaked with 0.1N sodium carbonate solution. After wiping with a water soaked pad, the element is dried. The green image resulting is a negative of the original transparency.

By repeating this process with appropriate colored contiguous layers, a high density overlay color proof can be obtained using elements of the above type wherein the optical density of the colorant in the contiguous layer can be increased substantially, as desired, e.g., an optical density of at least 3.0, preferably 4.0 without substantially changing the characteristics of the photoadherent layer. Thus, exposure and stripping characteristics of the element will be substantially the same regardless of the colorant or density used in the contiguous layer.

EXAMPLE 3

An element wherein the photoadherent layer contains a colorant is made as follows:

I. Photoadherent Layer: Colored Photopolymerizable Composition

A photoadherent layer which adheres to the cover sheet only in the unexposed areas is made from photosensitive composition prepared with the following ingredients:

Polymethyl methacrylate (Inherent Viscosity 0.20–0.22 for a solution of 0.25 g. in 50 mls. chloroform, at 20° C. using a No. 50 Cannon-Fenske Viscosimeter): 1.55 g
Chlorinated rubber (Parlon ® S-5 by Hercules Powder Company) 67% chlorinated-20% solution in toluene at 25° C. has a viscosity of 4–7 centipoise: 21.0 g
Pentaerythritol triacrylate: 20.0 g
2-Tertiary butyl anthraquinone: 2.1 g
Triethylene glycol acetate: 2.35 g
2,2'-Methylene-bis-(4-ethyl-6-t-butylphenol): 2.35 g
Victoria Pure Blue (CI 44045) dye: 0.50 g
Methylene chloride: 200.0 g The ingredients are thoroughly mixed and coated using a 0.002-inch doctor knife on a 0.001-inch transparent polyethylene terephthalate base allowed to dry.

II. Continguous Layer: Solvent Soluble, Non-Tonable Layer

A solvent soluble, non-tonable layer is prepared as in part II of Example 2 except that the coating composition contains no colorant.

III. Lamination Procedure

The same procedure as that of part III of Example 2 is used.

IV. Exposure, Delamination and Wash Out Procedure

The laminated element resulting from step III is exposed through a halftone color separation transparency (next to the cover sheet) by means of a pulsed Xenon lamp (nuArc Flip-Top Model 17 ampere) for 2 minutes. Five minutes after exposure, the element is delaminated by stripping the polyethylene terephthalate cover sheet from the imaged photoadherent layer. The unexposed areas of the blue photopolymerizable layer adheres to the cover sheet and are removed therewith to form a positive image (a blue duplicate) of the color separation transparency. The complementary exposed blue image areas photoadhere to the contiguous layer to give a negative or reverse image of the color separation transparency. The bared areas of the contiguous layer are removed as in part IV of Example 2 thereby removing any background stain due to the colorant of the removed unexposed areas. By repeating the process with appropriate colored photopolymer layers, an overlay color proof free of stain can be obtained using the above element. Both reverse and duplicate overlays can be formed from the peeled elements.

EXAMPLE 4

A high density litho negative is prepared using the following procedures:

I. Photoadherent Layer

A photopolymerizable composition containing a colorant is prepared and coated on 0.001 inch-thick polyethylene terephthalate film as described in Example VIII of U.S. Pat. No. 3,770,438.

II. Contiguous Layer

A water soluble contiguous layer coating composition is made from the following components:
Polyvinyl pyrrolidone (20% solution): 13.0 g
Polyvinyl alcohol (10% solution): 5.0 g
Carbon black: 25.0 g
Isooctyl phenyl polyethoxy ethanol: 5.0 ml
Water: 40.0 gm This composition is coated on a polyethylene terephthalate film having a gelatin sublayer.

III. Lamination Procedure

Elements from I and II are laminated in surface to surface contact of the coated layers at room temperature with a pressure of 40 pounds per square inch.

IV. Exposure, Delamination and Wash Out Procedure

The laminated element resulting from Step III is exposed for 90 seconds through a contact litho positive (next to the cover sheet contiguous to the photoadherent layer) to a carbon arc in an exposing device identified as a nuArc Plate Maker. The polyethylene terephthalate cover sheet is stripped and the unexposed areas of the photopolymerizable layer adhere thereto to give a low density (~0.35) duplicate of the contact positive. The bared areas of the black contiguous layer are washed out with cold water, leaving a black reverse negative image of the contact positive with an optical density above 3.0 and free of pinhole defects. The resulting image can be used as a contact litho negative.

The foregoing examples represent preferred embodiments of the invention, wherein the unexposed areas of the photoadherent layer adhere to and are removed by stripping the cover sheet, the exposed areas of the photoadherent layer which remain on the contiguous layer being insoluble in a solvent in which the contiguous layer is soluble due to the difference in the solubility of the original materials of which these layers are composed. However, the difference in solubility may be increased by an intermediate treatment, e.g., additional exposure to actinic radiation, in other embodiments. For example, such an exposure of the element, nonimagewise, after stripping the cover sheet could serve to further photoharden the remaining areas of the photoadherent layer and simultaneously solublize the bared areas of the contiguous layer if it is composed of photosoluble material. As used herein, therefore, a "soluble" contiguous layer includes contiguous layers which are soluble without an intermediate treatment and also those which are soluble with an intermediate treatment. Likewise, "insoluble" denotes materials which are insoluble or capable of being rendered insoluble. The terms, of course, have reference to the same solvent. In preferred embodiments, no intermediate treatment is required, the difference in solubility existing at least immediately after stripping the cover sheet.

As exemplified, the elements of the invention may be used to form a resist image on a surface by laminating the contiguous layer to the surface. Where there is a sheet support on the contiguous layer, it is removed before laminating. Then the cover sheet is stripped off and areas of the contiguous layer are washed out, leaving a polymeric resist image on the surface. It is desirable that the resist image be easily visible, and a colorant may be therefore contained in the contiguous layer. Since the contiguous layer need not be photosensitive, the colorant need not be of any particular type for this purpose.

The resist image may be used in a process of permanently modifying the adjacent areas on the surface which are unprotected by the resist image by using a reagent capable of etching said adjacent areas or depositing a material on (e.g., plating) said adjacent areas. In such a case, wash out of the contiguous layer simultaneously with or in the same medium used for surface modification (e.g., an etching bath) is within the scope of the invention.

We claim:

1. A peel apart photosensitive element comprising in order from top to bottom, (1) a strippable cover sheet, (2) a sole dry photoadherent layer comprising a material with ethylenically unsaturated or benzophenone type groups, (3) a solvent-soluble, nontanable, polymeric, nonphotosensitive contiguous layer, and (4) a sheet support, the exposed areas of said photoadherent layer, after imagewise exposure of said element through the cover sheet (1) to actinic radiation, having greater adhesion to said contiguous layer than to said cover sheet and are not removable with said cover sheet and the unexposed areas of said photoadherent layer having greater adhesion to said cover sheet than to said contiguous layer and are removable with said cover sheet whereby after stripping the cover sheet (1) leaving an unhardened positive image on the cover sheet and an image of uncovered contiguous layer on the element, said exposed areas of the photoadherent layer being insoluble under a condition under which said contiguous layer is solvent-soluble.

2. An element according to claim 1 wherein said contiguous layer contains an added colorant.

3. An element according to claim 1 wherein said strippable cover sheet is a polymeric film which is transparent to actinic radiation.

4. An element according to claim 3 wherein said strippable cover sheet is a polyethylene terephthalate film.

5. An element according to claim 1 wherein said contiguous layer is comprised of a polymeric material that is soluble in an aqueous solution.

6. An element according to claim 1 wherein said photoadherent layer contains an added colorant.

7. An element according to claim 2 wherein said colored contiguous layer has an optical density of at least 3.0.

8. An element according to claim 1 containing an auxiliary layer interposed between the contiguous layer (3) and the sheet support (4).

9. An element according to claim 8 wherein the auxiliary layer is a release layer.

10. An element according to claim 8 wherein the auxiliary layer is an anchoring layer.

11. An element according to claim 8 wherein the auxiliary layer is thermoplastic.

12. An element according to claim 1 wherein the sheet support (4) has a metal surface in contact with the surface of said contiguous layer.

13. An element according to claim 12 wherein the metal surface is copper.

14. An element according to claim 1 wherein the sheet support (4) is transparent.

15. An element according to claim 1 wherein the sheet support (4) is a polymeric film.

16. An element according to claim 15 wherein the polymeric film is polyethylene terephthalate.

17. An element according to claim 1 wherein the sheet support (4) contains an added colorant.

18. An element according to claim 17 wherein the colored sheet support has an optical density of at least 3 over a portion of the visible or actinic spectrum.

* * * * *